(12) United States Patent
Frazee et al.

(10) Patent No.: US 11,510,322 B2
(45) Date of Patent: Nov. 22, 2022

(54) FLEXIBLE CIRCUITS FOR USE WITH GASKETS IN ELECTRONIC EQUIPMENT AND RELATED SYSTEMS AND METERS

(71) Applicant: Sensus Spectrum, LLC, Morrisville, NC (US)

(72) Inventors: Eric Frazee, Holly Springs, NC (US); Michael Zimmerman, Addison, PA (US); Christian Heizenroeder, Durham, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 606 days.

(21) Appl. No.: 16/517,940

(22) Filed: Jul. 22, 2019

(65) Prior Publication Data

US 2021/0029834 A1 Jan. 28, 2021

(51) Int. Cl.
*H05K 3/32* (2006.01)
*F16J 15/12* (2006.01)
*H05K 3/34* (2006.01)

(52) U.S. Cl.
CPC ............ *H05K 3/326* (2013.01); *F16J 15/121* (2013.01); *H05K 3/3452* (2013.01)

(58) Field of Classification Search
CPC ........ H05K 3/326; H05K 3/3452; H05K 3/32; F16J 15/121
See application file for complete search history.

(56) References Cited

U.S. PATENT DOCUMENTS

| 2007/0254636 A1 | 11/2007 | Vagt |
| 2009/0020962 A1 | 1/2009 | Shinoda et al. |
| 2010/0313675 A1 | 12/2010 | Goegge et al. |
| 2011/0090652 A1 | 4/2011 | Wee et al. |

FOREIGN PATENT DOCUMENTS

| CN | 208 688 595 U | 4/2019 |
| WO | WO 2009/098844 A | 8/2009 |

OTHER PUBLICATIONS

International Search Report, PCT/US2020/042752, dated Nov. 2, 2020, 10 pages.

*Primary Examiner* — Tremesha S Willis
(74) *Attorney, Agent, or Firm* — Stanek Lemon Crouse & Meeks, PA (57) ABSTRACT

Systems for reducing leakage at a pressure barrier in a gas meter, are provided including first and second gaskets; a flexible circuit having variable thicknesses, such that a thicker portion of the flexible circuit is provided between the first and second gaskets; and a mounting plate on the flexible circuit, the mounting plate compressing the flexible circuit between the first and second gaskets on a non-pressurized side of the pressure barrier of the gas meter. Related flexible circuits and gas meters are also provided.

20 Claims, 6 Drawing Sheets

FLEXIBLE CIRCUITS FOR USE WITH GASKETS IN ELECTRONIC EQUIPMENT AND RELATED SYSTEMS AND METERS

FIELD

The present inventive concept relates generally gaskets and, more particularly, to flexible circuits for use with gaskets to create improved seals therethrough.

BACKGROUND

Electronic equipment often includes gaskets therein to seal a junction between two surfaces or elements. For example, in a gas meter, a gasket may be used to seal a pressure bather in the gas meter. These gaskets can be a shaped piece or ring of rubber or other flexible material. Gaskets are generally designed to mold around the element being passed through the gasket to seal the junction. In other words, the gasket is provided to reduce the amount of leakage therethrough. However, once the element is positioned, there is generally a "void" that can cause leakage. Improved methods of sealing elements when positioned is desired.

SUMMARY

Some embodiments of the present inventive concept provide systems for reducing leakage at a pressure barrier in a meter, the systems including first and second gaskets; a flexible circuit having variable thicknesses, such that a thicker portion of the flexible circuit is provided between the first and second gaskets; and a mounting plate on the flexible circuit, the mounting plate compressing the flexible circuit between the first and second gaskets on a non-pressurized side of the pressure barrier of the meter.

In further embodiments, the flexible circuit may include first and second thicknesses, the first thickness being less than the second thickness; a portion of the flexible circuit, having the second thickness may be compressed between the first and second gaskets; and an outer edge of the portion of the flexible circuit having the second thickness may be free of at least adhesive and solder mask.

In still further embodiments, a thickness of the flexible circuit may taper from a largest thickness to a smallest thickness, the largest thickness being less than the smallest thickness; a portion of the flexible circuit having the largest thickness may be compressed between the first and second gaskets; and wherein an outer edge of the portion of the flexible circuit having the largest thickness may be free of at least adhesive and solder mask.

In some embodiments, provision of the thicker portion of the flexible circuit between the first and second gaskets may provide a substantially reduced leakage path.

In further embodiments, the meter may be a gas meter and no substantial leak may be detected up to at least about 120 psi.

In still further embodiments, the system may provide at least six times more leak tightness against internal pressure relatives to conventional systems.

Some embodiments of the present inventive concept provide a feathered flexible circuit for use in a meter including a flexible circuit having variable thicknesses, a thicker portion of the flexible circuit being provided between first and second gaskets to decrease a leakage path of a pressure barrier, wherein the flexible circuit is mounted on a non-pressurized side of the pressure barrier.

Further embodiments of the present inventive concept provide a gas meter having a pressure barrier therein, the gas meter including first and second gaskets on a non-pressurized side of the pressure barrier; a flexible circuit having variable thicknesses, such that a thicker portion of the flexible circuit is provided between the first and second gaskets; and a mounting plate on the flexible circuit, the mounting plate compressing the flexible circuit between the first and second gaskets on a non-pressurized side of the pressure barrier of the gas meter.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", an and "the" are intended to include the plural firms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to. describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed above, electronic equipment often includes gaskets therein to seal a junction between two surfaces or elements. For example, in a gas or water meter, a gasket may be used to seal a pressure barrier in the meter. These gaskets can be a shaped piece or ring of rubber or other flexible material. The gasket is generally designed to mold itself around the element being passed through the gasket to seal the junction. In other words, the gasket is provided to reduce the amount of leakage therethrough.

Figure 1A:
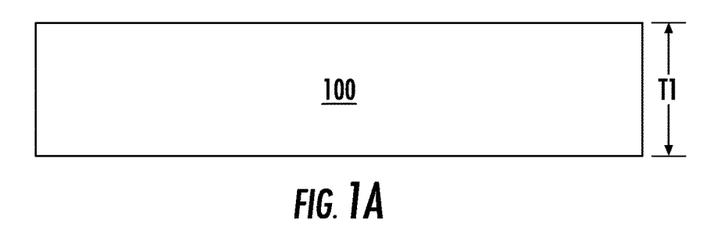
FIG. 1A is a diagram illustrating a conventional flexible circuit form factor.
Figure 1B:
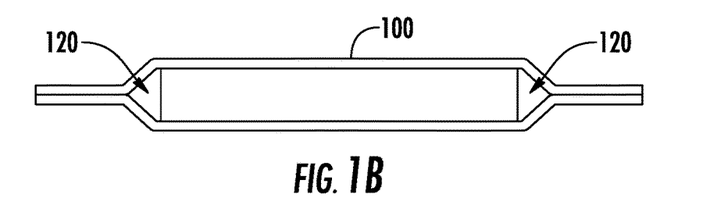
FIG. 1B is a diagram illustrating leak patterns for a conventional flexible circuit form factor.

For example, in a gas or water meter, when a conventional flexible circuit that generally has a rectangular/square form factor (FIG. 1A) and a uniform thickness T1 is positioned in a gasketed pressure barrier in the meter, it is difficult to adequately seal the void created by passing the circuit through the gasketed barrier. In particular, as shown in FIG. 1B leakage 120 may occur around the flexible circuit 100 where it is positioned between the gaskets. Thus, passing the flexible circuit through a gasketed passthrough past a pressure barrier can limit the leak performance of the seal provided by the gasket due to the inability of the gasket to fill the "void" left at the edge of the flexible circuit. Accordingly, some embodiments of the present inventive concept provide a flexible circuit that provides an improved seal when passing a flexible circuit through a gasketed pressure barrier in a meter as will be discussed further below with respect to FIGS. 2 through 9.

As used herein, a "flexible circuit" refers to a circuit positioned on a pliable or bendable printed circuit board (PCB) as opposed to a more traditional rigid PCB. Furthermore, although embodiments of the present inventive concept are discussed herein with respect to flexible circuits positioned in gasketed passthroughs in a gas meter, embodiments of the present inventive concept are not limited thereto. Flexible circuits discussed herein can be used in any type of device which would benefit from the inventive concept without departing from the scope of the present inventive concept. For example, in some embodiments, the flexible circuits may be used in a water meter.

Figure 2A:
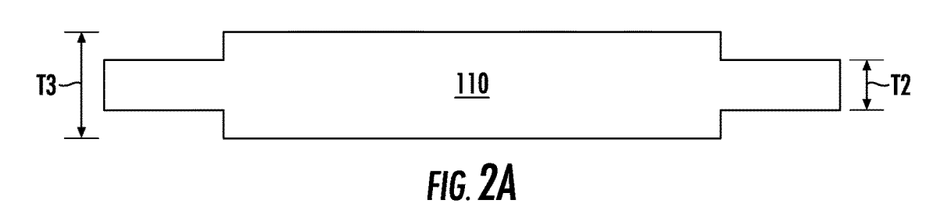
FIG. 2A is a block diagram illustrating a flexible circuit having a feathered feature in accordance with some embodiments of the present inventive concept.
Figure 2B:
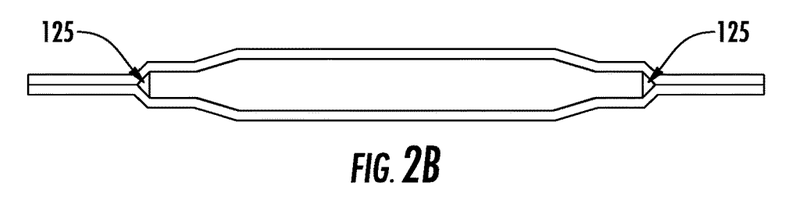
FIG. 2B is a diagram illustrating leak patterns for flexible circuit form factor in accordance with some embodiments of the present inventive concept.

As discussed above, positioning a square or rectangular circuit through or between a gasket(s) can leave voids at the sides thereof allowing unwanted leakage from the seal. Referring to FIGS. 2A and 2B, embodiments of the present inventive concept providing a "feathered" flexible circuit will be discussed. As illustrated in FIG. 2A, the flexible circuit 110 has a first thickness T2 and second thickness T3, the first thickness T2 being smaller than the second thickness T3. It will be understood that although embodiments of the present inventive concept are discussed herein as having two thicknesses T2 and T3, embodiments of the present inventive concept are not limited to this configuration. For example, the thickness may taper from one thickness to the next and therefore have a variety of thicknesses in between the first and second thicknesses as illustrate, for example, in FIGS. 3 and 8 discussed herein. The portion of the flexible circuit 110 that is wider (thicker) T3—the feathered portion—is the portion of the flexible circuit 110 that is positioned between the gaskets in the meter. In other words, the feathered portion is passed through the seal and the unfeathered (thinner portion) is left outside the gasket. As illustrated in FIG. 2B, providing the variable thicknesses may provide less leakage 125 than the flexible circuit 100 having a uniform thickness discussed above with respect to FIGS. 1A and 1B.

Figure 3:
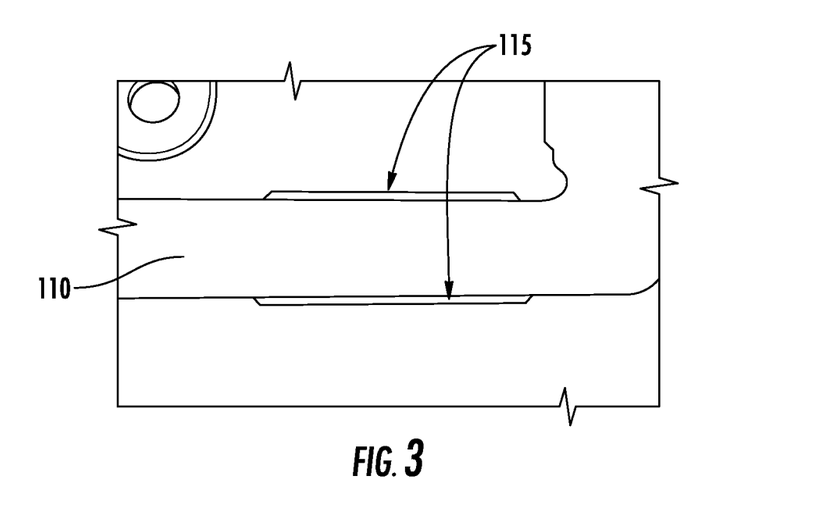
FIG. 3 is a top view of a portion of a flexible circuit having feathered edges in accordance with some embodiments of the present inventive concept.

As shown in FIG. 3, the thicker portion (feathered portion) of the flexible circuit 110 may not include all the same components as the remaining portion of the flexible circuit. For example, in some embodiments, on the thicker portion of the flexible circuit 115 adhesive and solder mask layers may be removed, for example, masked off, leaving only the core flexible material behind. Providing the extra flexible material 115 on the sides of the flexible circuit 110 allows for an improved seal, i.e. less leakage, when compressed within a gasket/gaskets, for example, an elastomeric gasket.

Figure 4:
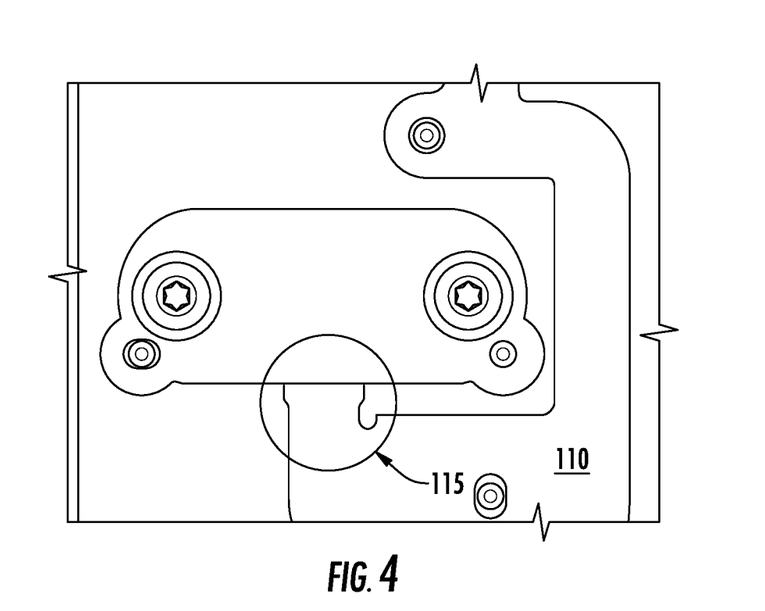
FIG. 4 is a top view of a flexible circuit positioned between gaskets in a gas meter in accordance with some embodiments of the present inventive concept.

A top view of a flexible circuit 110 positioned with the feathered portions 115 in the passthrough between the gaskets of a gas meter in accordance with some embodiments of the present inventive concept is illustrated, for example, in FIG. 4. As illustrated in FIG. 4, the compression on the flexible circuit 110 and the gaskets is provided outside the pressurized portion of the meter, i.e. before the pressure barrier. As discussed above and illustrated in FIG. 4, the width of the flexible circuit 110 is greater entering the gasketed passthrough. The increase in width continues through the compressed gasket region. Flexible circuits having feathered portions in accordance with embodiments discussed herein allow for a gasketed passthrough to be provided on the outside of the pressure vessel and may provide at least six times leakage tightness against internal pressure relative to conventional designs as will be discussed below.

It will be understood that the length and thickness of the flexible circuits discussed herein may vary depending on the device in which they are being used. Thus, any length and thickness may be conceived without departing from the scope of the present inventive concept. In some embodiments, the feathered flexible circuit is used in meters produced by Xylem, Inc.

Although embodiments of the present inventive concept are discussed herein as being used on pressure barriers outside a pressure vessel, embodiments of the present inventive concept are not limited to this configuration. For example, in some embodiments, the feathered flexible circuit discussed herein may be used on the pressurized side of the pressure vessel as well as internally without departing from the scope of the present inventive concept.

Figure 5:
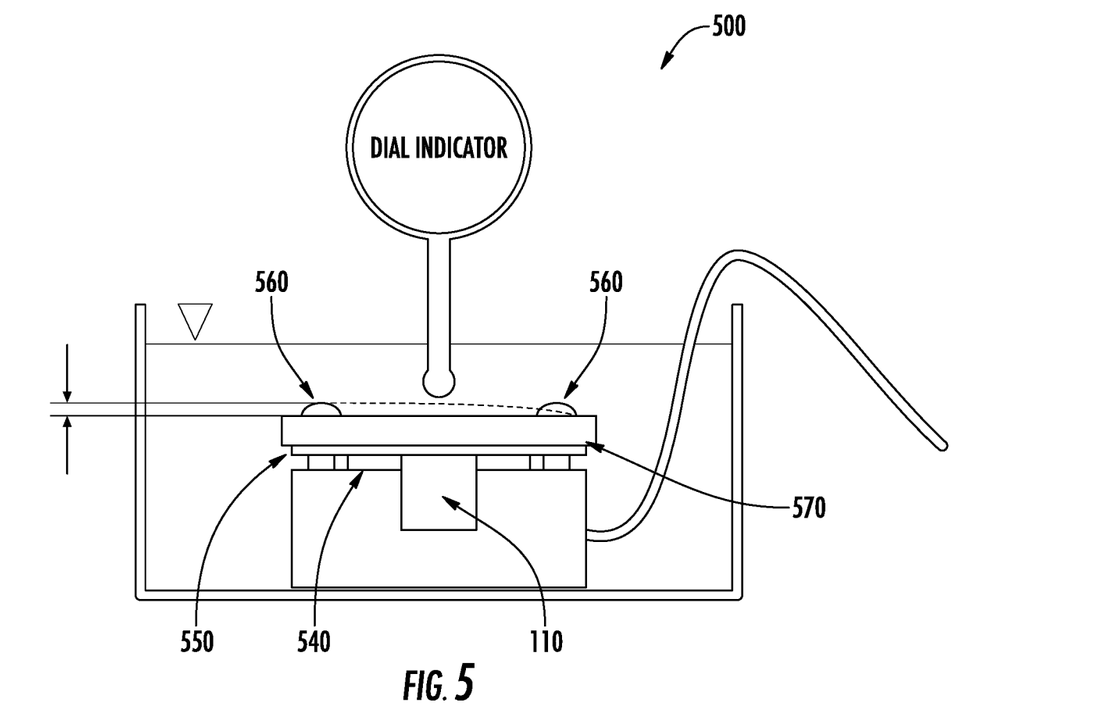
FIG. 5 is a block diagram illustrating a system configuration far a test of leak tightness and deflection in, accordance with some embodiments of the present inventive concept.

FIG. 5 is a block diagram illustrating a system configuration for a test of leak tightness and deflection in accordance with some embodiments of the present inventive concept. As illustrated in FIG. 5, in some embodiments, the feathered flexible circuit 110 is positioned between first 540 and second gaskets 550. In other words, the flexible circuit 115 is sandwiched between the two gaskets 540 and 550. A back-plate 570 is screwed on top of the two gaskets 540, 550 and the flexible circuit 110 using a plurality of screws 560. Although only two screws are show in FIG. 5 embodiments of the present inventive concept are not limited to this configuration. In embodiments of the present inventive concept, the back-plate is mounted on a non-pressurized side of the pressure barrier, which allows for more flexibility in design of meters.

Figure 6:
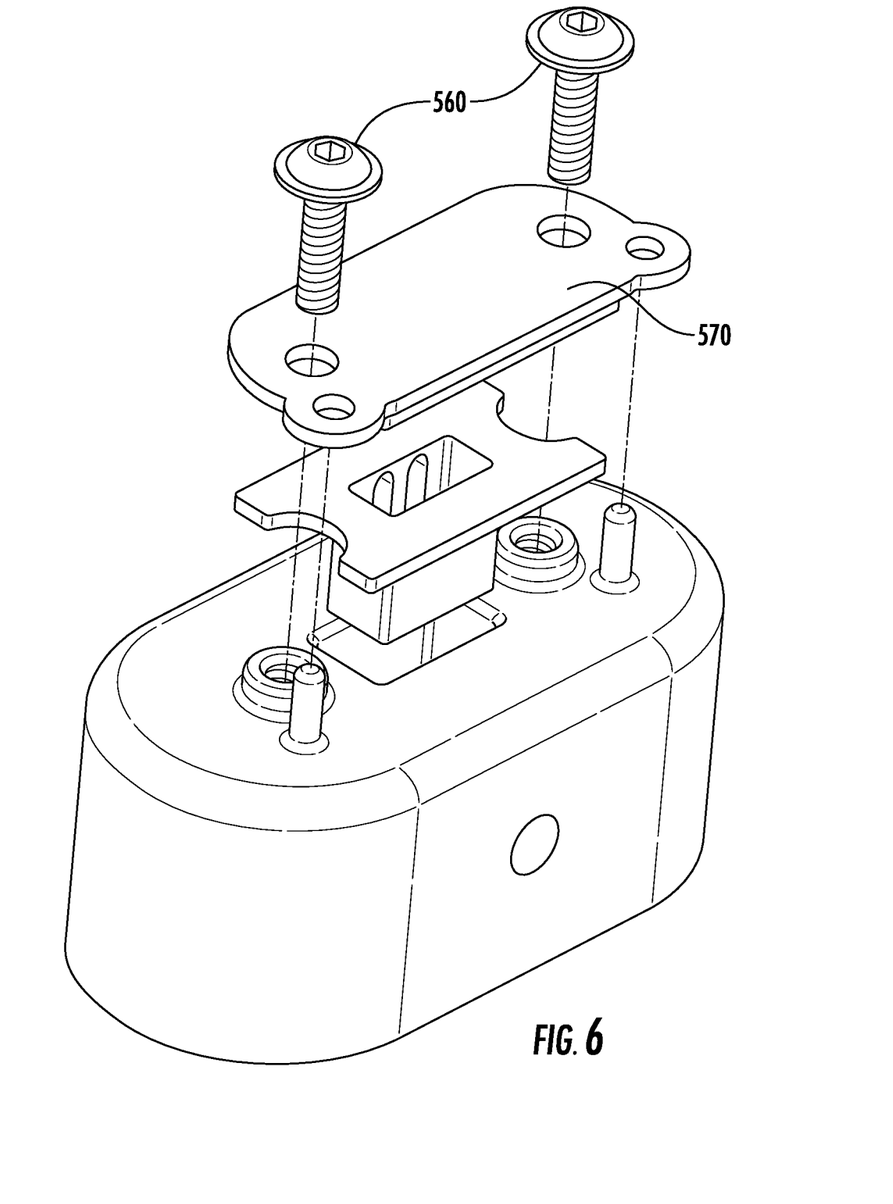
FIG. 6 is an exploded view of the valve connection in accordance with some embodiments of the present inventive concept.

FIG. 6 is an exploded view of the valve connection in accordance with some embodiments of the present inventive concept. As illustrated, the screws 560 and the back-plate are provided on the non-pressurized side of the pressure barrier in accordance with embodiments of the present inventive concept.

Figure 7:
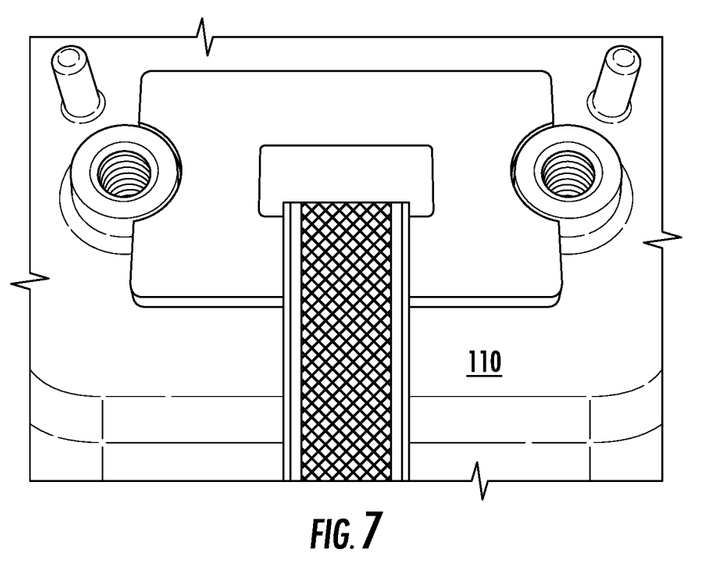
FIG. 7 is a diagram illustrating, the feathered flexible circuit positioned between gaskets during a test in accordance with some embodiments of the present inventive concept.
Figure 8:
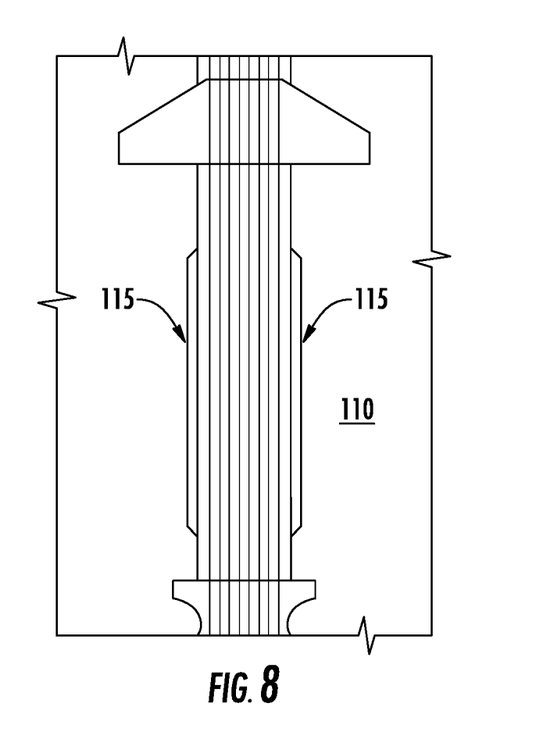
FIG. 8 is a diagram illustrating the feathered flexible circuit in accordance with some embodiments of the present inventive concept.
Figure 9:
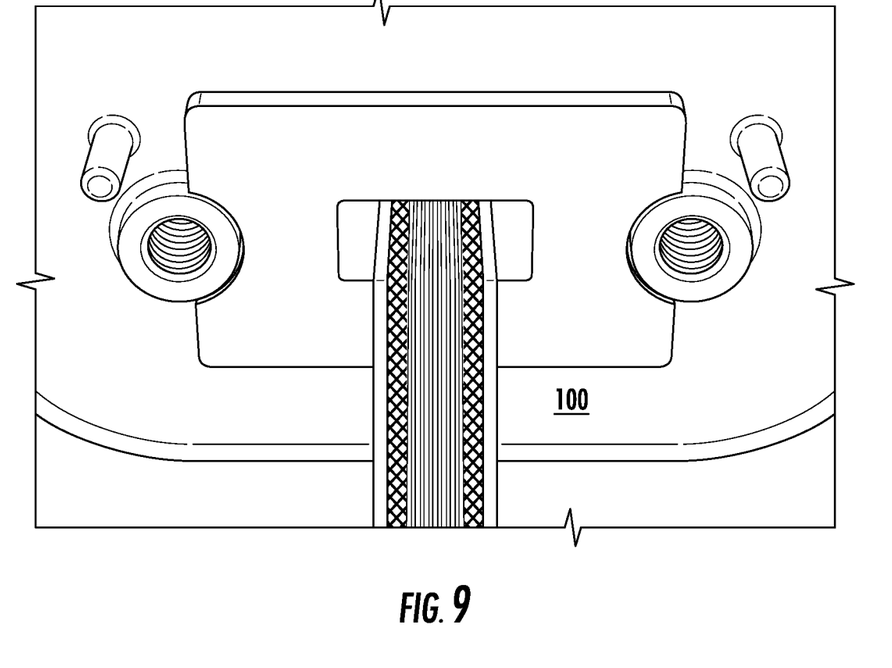
FIG. 9 is a diagram illustrating a conventional flexible circuit positioned between gaskets during a test in accordance with some embodiments of the present inventive concept.

Referring now to FIGS. 7 through 9, tests performed in accordance with some embodiments of the present inventive concept will be discussed. FIG. 7 is a diagram illustrating the feathered flexible circuit positioned between the gaskets during a test in accordance with some embodiments of the present inventive concept. FIG. 8 is a diagram illustrating the feathered flexible circuit in accordance with some embodiments of the present inventive concept. FIG. 9 is a diagram illustrating a conventional flexible circuit positioned between the gaskets during a test in accordance with some embodiments of the present inventive concept.

Tests on both the feathered flexible circuit 110 in accordance with embodiments discussed herein (FIGS. 7 and 8) and the conventional flexible circuit 100 (FIG. 9) were performed on 5 samples at pressures of 20 psi, 40 psi, 60 psi, 80 psi, 100 psi and 120 psi for one minute each using the system illustrated in FIG. 5. The feathered flexible circuit 110 illustrated in FIGS. 7 and 8 when positioned in the gasket as shown was leak free at all pressure levels. The flexible circuit 110 illustrated in FIG. 9, on the other hand, started streams of bubbles (leaks) at 20 psi in 3 out of the 5 samples tested.

As discussed briefly above, some embodiments of the present inventive concept provide flexible circuits having a thicker portion that is inserted through the gasket of a meter. Feathering the flex circuit as discussed herein may allow for unproved sealing and may provide the opportunity for the seal to be compressed through mechanical means from the outside of the pressure vessel, thus, providing flexibility in design.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A system for reducing leakage at a pressure barrier in a meter, the system comprising:
   first and second gaskets;
   a flexible circuit having a surface including electronics thereon, the flexible circuit having variable thicknesses such that some portions of the surface including electronics thereon are horizontally wider than remaining portions of the surface, wherein the wider portions of the flexible circuit are provided between the first and second gaskets; and
   a mounting plate on the flexible circuit, the mounting plate compressing the flexible circuit between the first and second gaskets on a non-pressurized side of the pressure barrier of the meter.

2. The system of claim 1:
   wherein the flexible circuit comprises first and second horizontal thicknesses, the first thickness being less wide than the second thickness;
   wherein a portion of the flexible circuit having the second thickness is compressed between the first and second gaskets; and
   wherein an outer edge of the portion of the flexible circuit having the second thickness is free of at least adhesive and solder mask.

3. The system of claim 1:
   wherein a thickness of the flexible circuit tapers from a largest thickness to a smallest thickness, the largest thickness being wider than the smallest thickness;
   wherein a portion of the flexible circuit having the largest thickness is compressed between the first and second gaskets; and
   wherein an outer edge of the portion of the surface of the flexible circuit having the largest thickness is free of at least adhesive and solder mask.

4. The system of claim 1, wherein provision of the wider portion of the flexible circuit between the first and second gaskets provides a substantially reduced leakage path.

5. The system of claim 1, wherein the meter is a gas meter and wherein during testing of the system no substantial leak is detected up to at least about 120 psi.

6. The system of claim 1, wherein the system provides at least six times more leak tightness against internal pressure relative to conventional systems.

7. A feathered flexible circuit for use in a meter, the feathered flexible circuit comprising:
   a flexible circuit having a surface including electronics thereon, the flexible circuit having variable thicknesses such that some portions of the surface including the electronic circuits thereon are horizontally wider than remaining portions of the surface, wherein the wider portions of the surface of the flexible circuit are provided between first and second gaskets to decrease a leakage path of a pressure barrier,
   wherein the flexible circuit is mounted on a non-pressurized side of the pressure barrier.

8. The flexible circuit of claim 7, wherein the flexible circuit is mounted using a mounting plate on the flexible circuit, the mounting plate compressing the flexible circuit between the first and second gaskets on a non-pressurized side of the pressure barrier of the meter.

9. The flexible circuit of claim 7:
wherein the flexible circuit comprises first and second thicknesses, the first thickness being less wide than the second thickness;
wherein a portion of the flexible circuit having the second thickness is compressed between the first and second gaskets; and
wherein an outer edge of the portion of the flexible circuit having the second thickness is free of at least adhesive and solder mask.

10. The flexible circuit of claim 7:
wherein a thickness of the flexible circuit tapers from a largest thickness to a smallest thickness, the largest thickness being wider than the smallest thickness;
wherein a portion of the flexible circuit having the largest thickness is compressed between the first and second gaskets; and
wherein an outer edge of the portion of the flexible circuit having the largest thickness is free of at least adhesive and solder mask.

11. The flexible circuit of claim 7, wherein provision of the wider portion of the flexible circuit between the first and second gaskets provides a substantially reduced leakage path.

12. The flexible circuit of claim 7, wherein during testing of a meter including the flexible circuit no substantial leak is detected up to at least about 120 psi.

13. The flexible circuit of claim 7, wherein provision of the flexible circuit in the meter provides at least six times more leak tightness against internal pressure relative to conventional meters.

14. The flexible circuit of claim 7, wherein the meter comprises a gas meter.

15. A gas meter having a pressure barrier therein, the gas meter comprising:
first and second gaskets;
a flexible circuit having a surface including electronic circuits thereon, the flexible circuit having variable thicknesses such that some portions of the surface including the electronic circuits thereon are horizontally wider than remaining portions of the surface, wherein the wider portions of the flexible circuit are provided between the first and second gaskets; and
a mounting plate on the flexible circuit, the mounting plate compressing the flexible circuit between the first and second gaskets on a non-pressurized side of the pressure barrier of the gas meter.

16. The gas meter of claim 15:
wherein the flexible circuit comprises first and second thicknesses, the first thickness being less wide than the second thickness;
wherein a portion of the flexible circuit having the second thickness is compressed between the first and second gaskets; and
wherein an outer edge of the portion of the flexible circuit having the second thickness is free of at least adhesive and solder mask.

17. The gas meter of claim 15:
wherein a thickness of the flexible circuit tapers from a largest thickness to a smallest thickness, the largest thickness being wider than the smallest thickness;
wherein a portion of the flexible circuit having the largest thickness is compressed between the first and second gaskets; and
wherein an outer edge of the portion of the flexible circuit having the largest thickness is free of at least adhesive and solder mask.

18. The gas meter of claim 15, wherein provision of the wider portion of the flexible circuit between the first and second gaskets provides a substantially reduced leakage path.

19. The gas meter of claim 15, wherein during testing of the gas meter no substantial leak is detected up to at least about 120 psi.

20. The gas meter of claim 15, wherein the gas meter provides at least six times more leak tightness against internal pressure relative to conventional gas meters.

* * * * *